(12) United States Patent
Ten Berge et al.

(10) Patent No.: US 7,253,077 B2
(45) Date of Patent: Aug. 7, 2007

(54) SUBSTRATE, METHOD OF PREPARING A SUBSTRATE, METHOD OF MEASUREMENT, LITHOGRAPHIC APPARATUS, DEVICE MANUFACTURING METHOD AND DEVICE MANUFACTURED THEREBY, AND MACHINE-READABLE STORAGE MEDIUM

(75) Inventors: Peter Ten Berge, Eindhoven (NL); Gerardus Johannes Joseph Keijsers, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 268 days.

(21) Appl. No.: 10/724,403

(22) Filed: Dec. 1, 2003

(65) Prior Publication Data

US 2005/0118781 A1    Jun. 2, 2005

(51) Int. Cl.
  *H01L 21/76* (2006.01)
(52) U.S. Cl. ............. 438/401; 438/975; 257/797
(58) Field of Classification Search ............... None
  See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,969,441 A | 10/1999 | Loopstra et al. | |
| 6,046,792 A | 4/2000 | Van Der Werf et al. | |
| 6,177,285 B1 | 1/2001 | Jantke et al. | |
| 6,686,214 B2 * | 2/2004 | Antaki et al. | 438/16 |
| 2001/0020750 A1 | 9/2001 | Chiba et al. | |
| 2002/0072193 A1 | 6/2002 | Antaki et al. | |

FOREIGN PATENT DOCUMENTS

| | | |
|---|---|---|
| WO | 98/33096 | 7/1998 |
| WO | 98/38597 | 9/1998 |
| WO | 98/40791 | 9/1998 |

OTHER PUBLICATIONS

Mattias Vangbo et al., High Precision Crystallographic Alignment of InP(100), Electrochemical and Solid-State Letters, 2(8) 1999, pp. 407-408.
G. Ensell, Alignment of mask patterns to crystal orientation, Sensors and Actuators A 53, (1996) pp. 345-348.
Mattias Vangbo et al., Precise mask alignment to the crystallographic orientation of silicon wafers using wet anisotropic etching, J. Micromech. Microeng. 6 (1996) pp. 279-284.
J. M. Lai et al., Precision alignment of mask etching with respect to crystal orientation, J. Micromech. Microeng. 8 (1998) pp. 327-329.

* cited by examiner

*Primary Examiner*—Leonardo Andujar
(74) *Attorney, Agent, or Firm*—Pillsbury Winthrop Shaw Pittman, LLP

(57) ABSTRACT

In a method according to one embodiment of the invention, a plurality of markers are printed in resist on a substrate at a range of angles relative to a crystal axis of the substrate. The markers are etched in to the substrate using an anisotropic etch process, such that after the etch the apparent positions of the markers are dependent on their orientation relative to the crystal axis. The apparent positions of the markers are measured, and from this information the orientation of the crystal axis is derived.

12 Claims, 3 Drawing Sheets

SUBSTRATE, METHOD OF PREPARING A SUBSTRATE, METHOD OF MEASUREMENT, LITHOGRAPHIC APPARATUS, DEVICE MANUFACTURING METHOD AND DEVICE MANUFACTURED THEREBY, AND MACHINE-READABLE STORAGE MEDIUM

FIELD OF THE INVENTION

The present invention relates to orientation determination and to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term "substrate" as used herein may also refer to a substrate that already contains multiple processed layers.

The term "projection system" should be broadly interpreted as encompassing various types of projection systems, including refractive optics, reflective optics, and catadioptric systems, for example. A particular projection system may be selected based on factors such as a type of exposure radiation used, any immersion fluid(s) or gas-filled area(s) in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams (such as ion or electron beams).

In some devices that are made using lithographic techniques (for example, devices including optical waveguides), it may be desirable or necessary for the device to be correctly aligned to the crystal structure of the substrate on which it is built. In conventional silicon wafers, the flat may be formed by cleaving the silicon crystal before it is sawn into wafers and hence may give an indication of the crystal axis. In wafers with a notch rather than a flat, the position of the notch may indicate the orientation of the crystal axis. However, such flats and notches may only indicate the {110} crystal axis to within ±1°, which is insufficient for many applications. Although GaAs {011} and InP {011} wafers are typically specified with a tolerance of ±0.5°, again more accurate alignment may be desired or necessary. It is desirable to obtain a methodology for determining crystal orientation of semiconductor substrates that can be easily automated and the results of which may be fed directly into a production process.

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion," respectively.

SUMMARY

A method of preparing a substrate according to one embodiment of the invention includes exposing the substrate with a plurality of images, each image having a different orientation with respect to a crystal axis of the substrate. Each of the orientations is within four degrees of each of the other orientations. The substrate is anisotropically etched to form a plurality of alignment markers, such that a location of at least a portion of each of the plurality of alignment markers substantially coincides with a location of a corresponding portion of a corresponding one of the plurality of images.

In a method of determining an orientation of a crystal axis of a substrate according to another embodiment of the invention, the substrate has provided thereon a plurality of alignment markers. A feature of each of the plurality of alignment markers has a predetermined position, and each of the plurality of alignment markers has a different orientation relative to a crystal axis of the substrate. The method includes measuring a position of each among the plurality of alignment markers; determining deviations of the measured positions from the corresponding predetermined positions; and determining the orientation of the crystal axis relative to the plurality of alignment markers from the deviations. Substrates, lithographic apparatus, and device manufacturing methods according to embodiments of the invention are also disclosed herein.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, methods and apparatus that may be used to accurately or conveniently measure an orientation of a crystal axis of a substrate.

Figure 1:
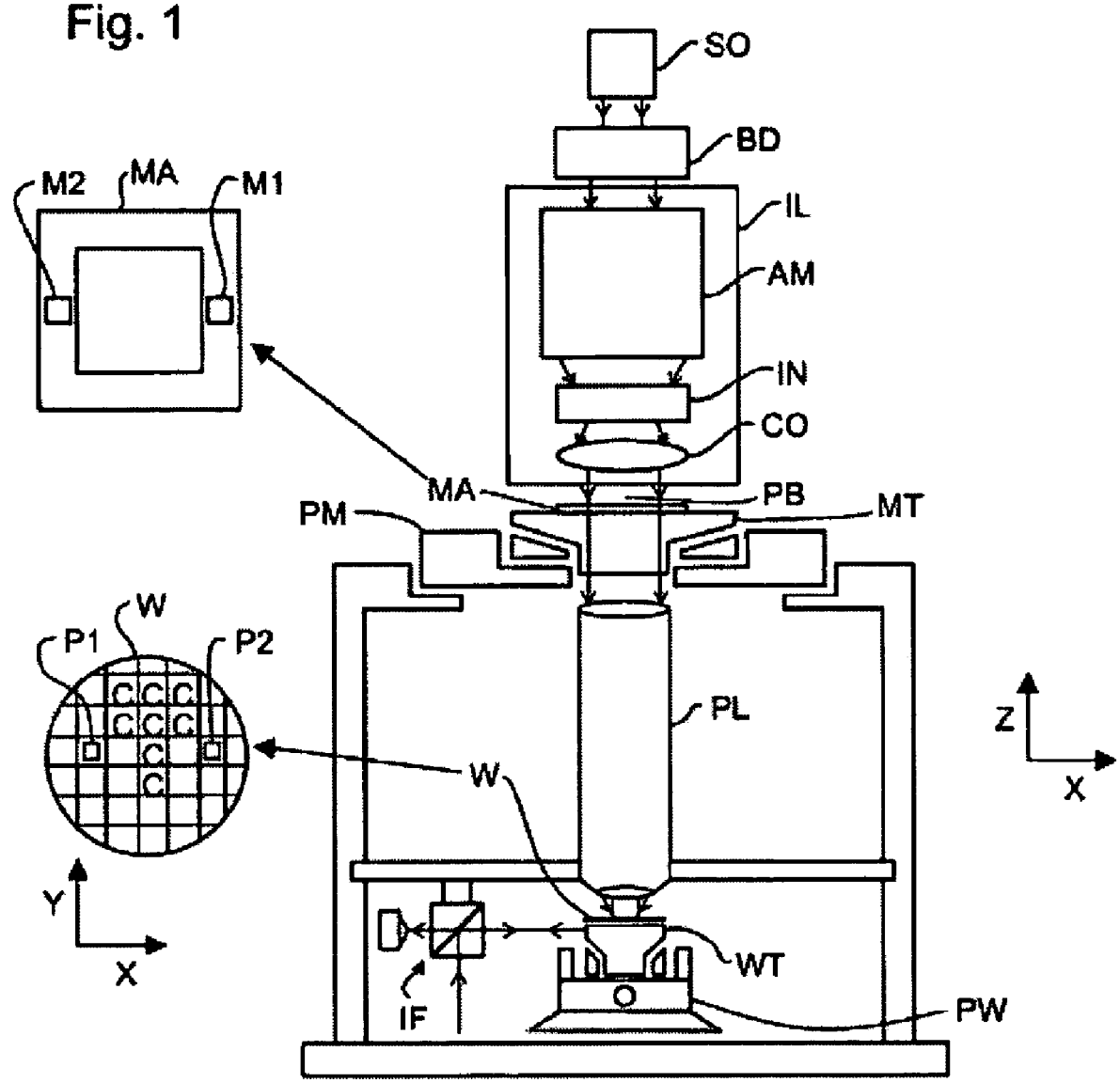
FIG. 1 depicts an imaging apparatus in conjunction with which an embodiment of the current invention can be employed.

FIG. 1 schematically depicts a lithographic projection apparatus in conjunction with which an embodiment of the current invention can be employed. The apparatus comprises:

A radiation system configured to supply (e.g. having structure capable of supplying) a projection beam of radiation (e.g. UV or EUV radiation). In this particular example, the radiation system RS comprises a radiation source SO, a beam delivery system BD, and an illumination system IL including adjusting structure AM for setting an illumination node, an integrator IN, and condensing optics CO;

A support structure configured to support a patterning structure capable of patterning the projection beam. In this example, a first object table (mask table) MT is provided with a mask holder for holding a mask MA (e.g. a reticle), and is connected to a first positioning structure PM for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure PW for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask or programmable patterning structure) or have aspects of both types.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a beam delivery system BD, which may include suitable directing mirrors and/or a conditioning structure or field, such as a beam expander. The illuminator IL may comprise an adjusting structure or field AM for setting the outer and/or inner radial extent (commonly referred to as σ-outer and σ-inner, respectively) of the intensity distribution in a pupil plane of the illuminator, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA may have a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure PW (and position sensor IF), the substrate table WT can be moved accurately, e.g. so as to position different target portions C in the path of the beam PB. Similarly, the first positioning structure PM and another position sensor (not shown) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which may form part of the positioning structures PM and/or PW and which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT and the substrate table WT are kept essentially stationary (at least relative to one another) while an entire mask image is projected at once (i.e. in a single "flash") onto a target portion C. The substrate table WT is then shifted in the x and/or y directions so that a different target portion C can be irradiated by the beam PB. In this mode, the maximum size of the exposure field may limit the size of the target portion C imaged in a single static exposure;

2. In scan mode, essentially the same scenario applies, except that a given target portion C is not exposed in a single "flash". Instead, the mask table MT and the substrate table WT are scanned (e.g. synchronously) while a pattern imparted to the projection beam is projected onto a target portion C (e.g. a single dynamic exposure). The velocity and direction of the substrate table WT relative to the mask table MT may be determined by the magnification (or demagnification) and image reversal characteristics of the projection system PL. For example, the mask table MT may be movable in a given direction (the so-called "scan direction", e.g. the y direction) with a speed v, so that the projection beam PB is caused to scan over a mask image, while concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution. In scan mode, the maximum size of the exposure field may limit the width (in a non-scanning direction) of the target portion in a single dynamic exposure, while the length of the scanning motion may determine the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed. For example, a continuous scan mode may be essentially the same as the pulsed mode except for the use of a substantially constant radiation source, a pattern on a programmable patterning structure being updated as the beam scans across the substrate and exposes it.

Figure 2:
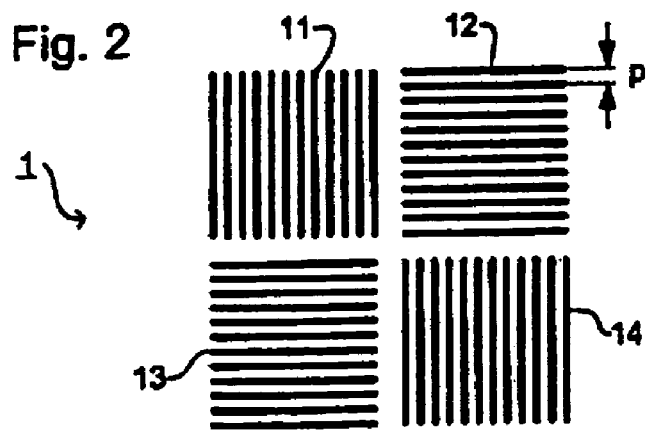
FIG. 2 shows a modified alignment marker usable in embodiments of the present invention.

FIG. 2 shows an alignment marker 1 which is based on a standard form of marker but modified for use in an embodiment of the invention. As can be seen in FIG. 2, the alignment marker 1 comprises four quadrants 11 to 14, each of which comprises a grating structure. Two of the quadrants 11, 14 have their grating lines aligned in a first direction (horizontal in the Figure), and the other two quadrants 12, 13 have their grating lines arranged in a perpendicular direction (vertical in the Figure). The grating lines in e.g. quadrants 11 and 14 are modified from the standard form to enable measurement of an orientation of a crystal axis.

Figure 3:
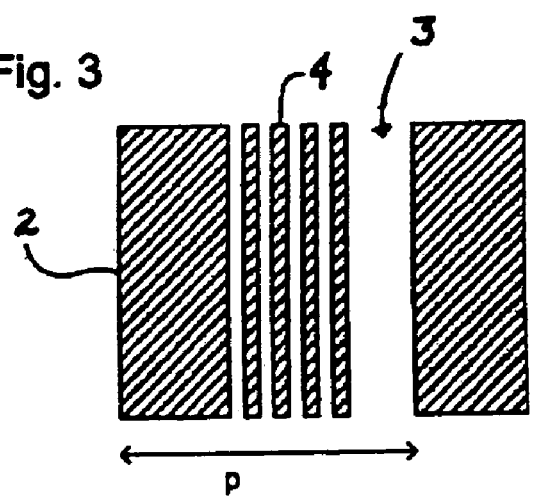
FIG. 3 is an enlarged view of a part of the line structure of the alignment marker of FIG. 2.

As shown in FIG. 3, which is an enlarged view of part of the line structure of quadrant 11, the grating period p comprises a structure of three parts: a solid area 2, a clear area 3 and a striped area 4. The striped area has a number of lines (four in the embodiment as shown, but more or fewer may also be used), with a line width and pitch much smaller than the pitch of the grating 14, which may be about 16 microns. In general, it may be desirable for the critical dimensions of the features of the orientation-sensitive part of the marker to be as small as can be printed with the lithographic apparatus used to print the marker.

Such a marker can be made sensitive to its orientation relative to the crystal axis of the substrate by etching it into the substrate using an anisotropic etching step. In such an etching step, the substrate is preferentially etched in a particular direction, e.g. parallel to the {001} crystal axis, as compared to the perpendicular direction. If the marker is aligned to the direction of preferential etching, the orientation-sensitive (striped) parts of the marker will tend to etch more strongly than if the marker is at an angle to that direction, so that the center of gravity of the marker will shift. One example of how this effect may be achieved is shown in FIGS. 4A to E.

FIGS. 4A to E show in cross-section examples of the structures that may result when the marker is exposed in resist at various different angles relative to the crystal axis and then etched into the substrate with an anisotropic etch process. The details of the anisotropic etch procedure will determine the precise angles under which the structures are etched and the exact forms of the structures etched at different angles.

As shown in FIG. 4A, if the marker is at a large positive angle to the crystal axis, the lines of the stripped area may be completely etched away such that the marker consists only of the solid parts. When the position of the marker is measured, the result is a position centered on the solid areas, as shown by the arrow. If the marker is at a small angle relative to the crystal axis, as in FIG. 4B, the stripped lines may appear in the etched marker with reduced widths. The measured position, which relates to the center of gravity of the marker, will be shifted over as indicated by the arrow. With the marker correctly aligned with the crystal axis, as in FIG. 4C, the stripped area will appear fully in the etched structure and the displacement of the measured position will be maximum. The effect is the same for negative angles, as shown in FIGS. 4D & E.

A similar effect can be achieved in other types of marker using areas that are similarly striped or have other types of sub-resolution divisions. The alignment marker may take the form of any standard markers, for example: gratings, groups of gratings, chevrons, and/or boxes. Sensitivity to orientation can be provided by including in each marker at least one area having a plurality of relatively small elements on a contrasting background.

Figure 5:
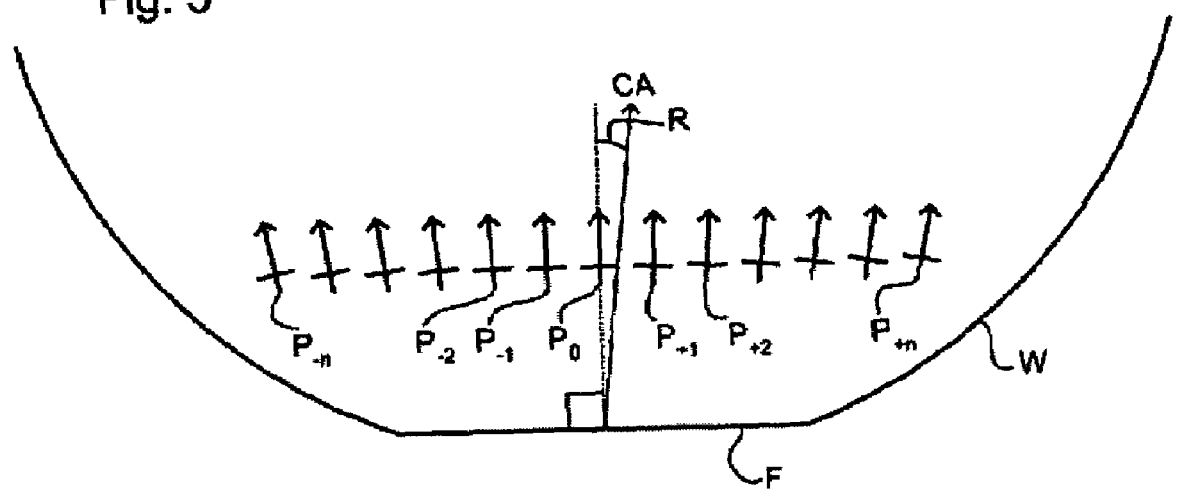
FIG. 5 is a plan view of a substrate according to an embodiment of the invention.

FIG. 5 shows a wafer W on which a method according to an embodiment of the present invention may be used to find the orientation of the crystal axis CA. The wafer W has a flat F which is nominally perpendicular to the crystal axis CA, but in practice the crystal axis CA may be at an angle R of up to ±1° away from the normal to the flat. (Note that certain angles and marker sizes may be exaggerated in FIG. 5 for clarity.)

A series of alignment markers $P_{-n}$ to $P_{+n}$, as described above (but represented in FIG. 5 by arrows), is exposed into resist on the substrate at differing angles $r_n$ relative to the normal to the flat F. It may be desirable for the angles of the alignment markers $P_{-n}$ to $P_{+n}$ to span, or even to go beyond, the range of possible angles of the crystal axis C. It may also be desirable for the markers to be sufficient in number to provide a sufficient number of data points for interpolation and to average errors.

The markers are preferably exposed under the same conditions (alternatively, relevant variations may be factored out later in the method), and these conditions may be selected to be advantageous or optimum for the correct imaging of the striped part of the marker. The markers may be exposed in a single exposure (e.g. with a suitable mask containing images of all the markers at the respective angles) or in separate exposures (e.g. using a mask with an image of one or more markers (i.e. fewer than all), with the substrate being rotated appropriately for each imaging step). It may be desirable to print the markers close together (e.g. to minimize any position-dependent effects in imaging) and/or to print the markers in any spare space on the substrate (e.g. if it is to be used for production of devices).

The markers need not be positioned with a specific or even a consistent relationship between their position and their orientation relative to the normal to the flat F, but their relative positions should be known to an appropriate degree of accuracy. If global position markers have already been printed on the substrate, or are printed at the same time, it may be desirable to know the predetermined positions of the markers for crystal axis determination relative to the global position markers.

The resist is then developed in the usual way, and the alignment markers $P_{-n}$ to $P_{+n}$ are etched into the substrate with an anisotropic etching process. The exact etching process will depend on the material of the substrate, suitable processes being known for common substrate materials. For example, one suitable anisotropic etching process for a silicon substrate is a KOH etch for which the process conditions, especially the temperature, can be optimized to maximize the directional selectivity of the etch (e.g. with respect to a crystal axis).

To determine the orientation of the crystal axis CA, the absolute positions of the etched markers $P_{-n}$ to $P_{+n}$ may be measured using a standard alignment tool (e.g. the alignment tool built into a lithographic projection apparatus), and their displacements d from their expected positions (e.g. as exposed) are determined. The alignment scans may be carried out with the substrate table appropriately rotated so that the scans are correctly perpendicular to the markers.

Figure 6:
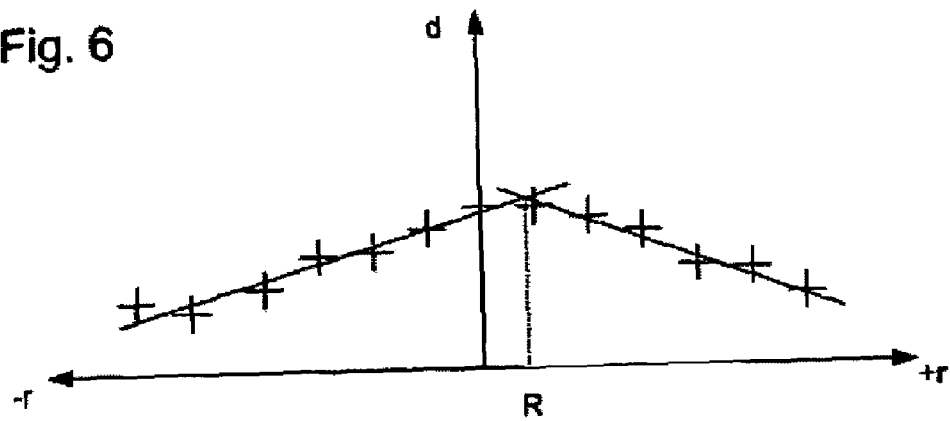
FIG. 6 is a graph of apparent position vs. angle as may be applied in an embodiment of the invention.

As discussed above, the closer the orientation of the alignment marker is to the crystal axis CA, the more strongly the striped part will have etched and so the more its center of gravity will have shifted, leading to a greater displacement of measured position from the nominal position at which it was exposed. The marker with the greatest apparent displacement can therefore be used as an indication of the orientation of the crystal axis. However, for greater accuracy, the displacements of several or all markers can be considered. For example, the displacements d may be fitted to two straight lines, one rising and one falling with increasing angle relative to the normal to the flat, and the orientation of the crystal axis may then be determined from the intersection of the two lines, as shown in FIG. 6.

Figure 4:
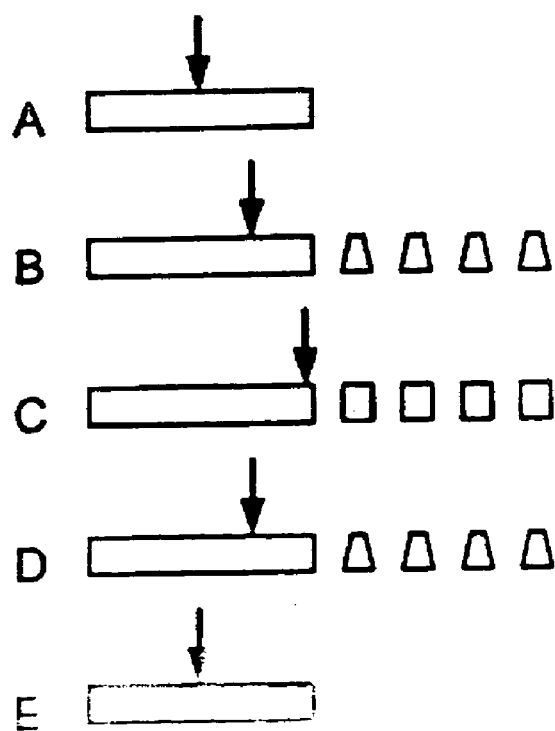
FIGS. 4A to E are views showing an effect of etching the alignment marker of FIG. 2 at different angles.

In methods according to other embodiments of the invention, other trends among characteristics (e.g. apparent displacements) of several or all of the markers may be evaluated to indicate crystal axis orientation. Other marker characteristics that may be used in such evaluations may be based on the zeroth-order moment (i.e. the mass of the marker, which may be expressed as the sum of the areas of the components of the marker) and/or higher-order moments, which moments may be taken along one or more axes. For example, the center of gravity as shown in FIG. 4 may be expressed as a first-order moment taken along one axis.

Once the orientation of the crystal axis relative to the flat is known, this value may be taken into account in the production of devices on the substrate. In particular, a device whose function is dependent on, or may be improved by, an exact alignment with one or other crystal axis (if the orientation of one crystal axis is known it is of course a matter of simple geometry to determine the orientation of the others) can be correctly positioned on the device. Correct positioning may be achieved by using known crystal axis orientation to appropriately position the global positioning (zero level) markers on the substrate or, if the positions of these are already fixed, the crystal axis orientation can be carried forward as a correction factor to be applied after alignment to the global positioning markers.

It will be appreciated that the steps of a method according to an embodiment of the present invention need not all be carried out at the same time or place. For example, the series of markers may be exposed and etched at the time and place of manufacture of the substrate, while the measurement of the apparent displacements and the determination of the value of the offset may be carried out at a time and place when devices are to be exposed on the substrate. As in a case when all steps are carried out at the time of production of devices, such a technique may have the potential advantage that the existing, highly accurate alignment systems of a lithographic apparatus may be used for the measurements. Also, if the substrate is not removed from a substrate table between measurement of the crystal axis offset and printing of the global positioning markers, then the possibility of error in using the flat as a reference may be avoided.

It is however also possible to carry out all steps up to determination of the orientation of the crystal axis remotely from the production of devices (e.g. at the time of manufacture of the substrates). In this case it is particularly convenient to take advantage of the fact that the flat (or notch, in the case of flatless wafers) is generally created before the individual substrates are cut from a single crystal. All wafers cut from one crystal will therefore have the same orientation of crystal axis relative to the flat (or notch). Thus, the measurement of the invention can be carried out on one substrate cut from a given crystal (or perhaps a sample including more than one substrate, e.g. to minimize error), and the result then applied to all substrates cut from that crystal. The measurement result, whether derived from individual measurements or batch measurements, may be marked on the substrate or an associated data carrier, in machine- and/or human-readable form, and/or entered into a database for retrieval at the time of use of the substrate.

It will be appreciated that if the markers used in a method according to an embodiment of the present invention take up an undesirable amount of space on the substrate, they may be put on the opposite side of the substrate to that used for production of devices, remembering of course that the offset value may need to have its sign changed when applied after inversion of the wafer. It may also be possible in some circumstances to remove the markers after they have been used in a method according to an embodiment of the invention.

A method of preparing a substrate according to one embodiment of the invention comprises providing on a surface of said substrate a plurality of alignment markers at respective predetermined positions, different ones of said alignment markers having different orientations relative to a crystal axis of said substrate and the form of said alignment markers being such that their apparent position is dependent on their orientation relative to said crystal axis.

By printing on the substrate a plurality of markers of different orientations and whose apparent positions depend on their orientations relative to the crystal axis, a rapid and accurate determination of the orientation of the crystal axis can be carried out using known and accurate alignment systems. In particular, the alignment system built into a lithographic apparatus may be used. The orientations of the alignment markers preferably span the expected range of variation of the orientation of the crystal axis and a little way either side: for example, between 0.5° to 2° either side of a nominal orientation of said crystal axis. The intervals between the orientations should be sufficient to give enough data points for interpolation and error averaging to give a measurement of the desired accuracy; for example, the orientations of the alignment markers may differ from each other by amounts in the range of from $(5\times10^{-6})°$ to $4°$. The smallest increment of angle may be determined by (or selected to correspond to) the minimum rotational step of the substrate table of a lithographic apparatus used to print and/or measure the markers.

It may be desirable to provide the dependence on orientation of the markers' positions by etching said alignment markers into the substrate using an anisotropic etching process.

In a method of determining the orientation of the crystal structure of a substrate according to another embodiment of the invention, the substrate has provided thereon a plurality of alignment markers at respective predetermined positions, with different ones of said alignment markers having different orientations relative to a crystal axis of said substrate. The method comprises measuring the positions of the plurality of alignment markers, determining the deviations of the measured positions of the alignment markers from the predetermined positions, and determining the orientation of a crystal axis relative to the plurality of alignment markers from the deviations. Such a method may be used with substrates as described herein to obtain the desired measurement of the orientation of the crystal axis.

The measurement of the orientation of the crystal axis may be carried out at a different time, and possibly also a different place, in which case it may be desirable to mark on the substrate, and/or other substrates cut from the same crystal, information indicative of the determined orientation, or to make an entry in a database representing the determined orientation.

A device manufacturing method according to an embodiment of the invention comprises providing a substrate; providing a projection beam of radiation using an illumination system; using a patterning structure to impart the projection beam with a pattern in its cross-section; and projecting the patterned beam of radiation onto a target portion of the substrate. During the projection, the orientation of the substrate relative to the projected pattern is determined at least in part by reference to information indicative of the orientation of a crystal axis that has been determined by a method as described herein.

In this way, structures whose function is dependent upon or improved by correct orientation with respect to the crystal axis of the substrate can be appropriately aligned to the crystal axis. Such a method may be performed so that the markers from which the orientation of the crystal axis is derived are provided on the opposite side of the substrate than the devices that are to be manufactured. Also, information indicative of the orientation of a crystal axis can be derived from measurements of a different substrate cut from the same single crystal.

Still further embodiments of the invention include a lithographic apparatus arranged to perform a method as described herein, and a data storage medium including a set of instructions (e.g. a computer program) to instruct a lithographic apparatus to perform one or more methods according to embodiments of the invention.

In some cases an embodiment of the invention can be implemented in the form of a software upgrade to an existing apparatus and hence may be provided in the form of a storage medium (e.g. a magnetic, optical, or phase-change medium such as a disk; a semiconductor medium such as read-only memory (ROM) or volatile or nonvolatile random-access memory (RAM)) having a computer program that includes code may be executed by a processor (e.g. the supervisory control system) of the lithographic apparatus to instruct the lithographic apparatus to perform a method according to an embodiment of the invention.

Whilst specific embodiments of the invention have been described above, it will be appreciated that the invention as claimed may be practiced otherwise than as described. For example, the principles of the invention may be applied not only in the manufacture of devices (such as semiconductor devices) with a heightened throughput, but apparatus according to embodiments of the invention may also be used to write masks at greatly increased speed. It is explicitly noted that the description of these embodiments is not intended to limit the invention as claimed.

In the claims appended hereto, recitation of "each" of a plurality of items, or "each" among a plurality of items, shall not be taken either to require or to exclude the presence of any additional instance or instances of the item that may not share the same features or limitations. Rather, the term "each" may also refer to a subset of the items present, wherein the claimed characteristics apply only to that subset. For example, a claim that recites "exposing the substrate with a plurality of images, each of the plurality of images having a different orientation with respect to a crystal axis of the substrate" is intended to cover exposing a substrate with such a plurality of images, whether or not there exist one or more additional images that may have the same orientation, with respect to the crystal axis, as each other or as any one or more of the plurality of images.

The invention claimed is:

1. A method of preparing a substrate, said method comprising:
   exposing the substrate with a plurality of images, each of the plurality of images having a different orientation with respect to a crystal axis of the substrate; and
   anisotropically etching the substrate to form a plurality of alignment markers, a location of at least a portion of each of the plurality of alignment markers substantially coinciding with a location of a corresponding portion of a corresponding one of the plurality of images,
   wherein the orientation of each of the plurality of images is within four degrees of the orientation of each other one of the plurality of images.

2. The method of preparing a substrate according to claim 1, wherein a distance between the orientations of each pair among the plurality of images is within the range of from $(5\times10^{-6})$ degrees to four degrees.

3. The method of preparing a substrate according to claim 1, wherein the orientation of at least one of the plurality of images is within the range of from 0.5 degrees to 2 degrees on one side of a nominal orientation of the crystal axis, and
   wherein the orientation of at least one of the plurality of images is within the range of from 0.5 degrees to 2 degrees on the other side of a nominal orientation of the crystal axis.

4. The method of preparing a substrate according to claim 1, said method further comprising:
   measuring a position of each of the plurality of alignment markers; and
   determining an orientation of the crystal axis based on the measured positions.

5. The method of preparing a substrate according to claim 4, said method further comprising marking, on at least one of the substrate and another substrate cut from the same crystal, information indicative of the determined orientation.

6. The method of preparing a substrate according to claim 1, wherein at least one of the plurality of alignment markers includes features selected from the group consisting of gratings, chevrons, and boxes.

7. The method of preparing a substrate according to claim 1, wherein at least one of the plurality of alignment markers comprises at least one area having a plurality of small elements on a contrasting background.

8. The method of preparing a substrate according to claim 1, wherein said alignment markers comprise a structure having a solid area, a clear area, and a striped area.

9. A method of preparing a substrate comprising: providing on a surface of the substrate a plurality of alignment markers, each of said plurality of alignment markers having a different orientation relative to a crystal axis of the substrate, wherein, for each of said plurality of alignment markers, a distance between an apparent position of the marker and an actual position of an element of the marker is dependent on the orientation of the marker.

10. The method of preparing a substrate according to claim 9, wherein a distance between the orientations of each pair among the plurality of alignment markers is within the range of from $(5 \times 10^{-6})$ degrees to 4 degrees.

11. The method of preparing a substrate according to claim 9, wherein the orientation of at least one of the plurality of alignment markers is within the range of from 0.5 degrees to 2 degrees on one side of a nominal orientation of the crystal axis, and wherein the orientation of at least one of the plurality of alignment markers is within the range of from 0.5 degrees to 2 degrees on the other side of a nominal orientation of the crystal axis.

12. The method of preparing a substrate according to claim 9, wherein providing said alignment markers comprises using an anisotropic etching process to etch said alignment markers into the substrate.

* * * * *